United States Patent
Weidner et al.

(10) Patent No.: US 9,105,771 B2
(45) Date of Patent: Aug. 11, 2015

(54) METHOD FOR PRODUCING AT LEAST ONE OPTOELECTRONIC SEMICONDUCTOR COMPONENT

(75) Inventors: Karl Weidner, München (DE); Hans Wulkesch, München (DE); Axel Kaltenbacher, Mintraching (DE); Walter Wegleiter, Nittendorf (DE); Johann Ramchen, Altdorf (DE)

(73) Assignee: OSRAM Opto Semiconductors GmbH (DE)

( * ) Notice: Subject to any disclaimer, the term of this patent is extended or adjusted under 35 U.S.C. 154(b) by 31 days.

(21) Appl. No.: 13/816,839

(22) PCT Filed: Aug. 12, 2011

(86) PCT No.: PCT/EP2011/063987
§ 371 (c)(1),
(2), (4) Date: Apr. 30, 2013

(87) PCT Pub. No.: WO2012/022695
PCT Pub. Date: Feb. 23, 2012

(65) Prior Publication Data
US 2013/0214323 A1  Aug. 22, 2013

(30) Foreign Application Priority Data
Aug. 17, 2010  (DE) .......................... 10 2010 034 565

(51) Int. Cl.
*H01L 31/0232* (2014.01)
*H01L 33/00* (2010.01)
(Continued)

(52) U.S. Cl.
CPC ............ *H01L 31/0232* (2013.01); *H01L 24/24* (2013.01); *H01L 33/0095* (2013.01);
(Continued)

(58) Field of Classification Search
USPC ............ 257/98–100, 434, E33.058, E33.059, 257/E33.061, E33.066, E33.062; 438/25–28, 43, 65–68, 106
See application file for complete search history.

(56) References Cited

U.S. PATENT DOCUMENTS

2002/0182845 A1  12/2002  Miyano et al.
2005/0255628 A1*  11/2005  Kinsman ......................... 438/64
(Continued)

FOREIGN PATENT DOCUMENTS

CN          101032034        9/2007
DE     10 2007 029 369 A1   1/2009
(Continued)

OTHER PUBLICATIONS

English translation of the Chinese Notification of the First Office Action dated Jun. 5, 2014 from corresponding Chinese Patent Application No. 201180039774.X.
(Continued)

*Primary Examiner* — Fernando L Toledo
*Assistant Examiner* — Lawrence-Linh T Nguyen
(74) *Attorney, Agent, or Firm* — DLA Piper LLP (US)

(57) ABSTRACT

A method of producing an optoelectronic semiconductor component includes providing a carrier having a top side, an underside situated opposite the top side, and a plurality of connection areas arranged at the top side alongside one another in a lateral direction; applying a plurality of optoelectronic components arranged at a distance from one another in a lateral direction at the top side, the components having a contact area facing away from the carrier; applying protective elements to the contact and connection areas; applying an electrically insulating layer to exposed locations of the carrier, contact areas and protective elements; producing openings in the insulating layer by removing protective elements; and arranging an electrically conductive material on the insulating layer and in the openings, wherein the electrically conductive material connects a contact area to an assigned connection area.

12 Claims, 3 Drawing Sheets

(51) Int. Cl.
*H01L 33/62* (2010.01)
*H01L 23/00* (2006.01)
*H01L 21/768* (2006.01)
*H01L 33/48* (2010.01)

(52) U.S. Cl.
CPC ............... *H01L33/48* (2013.01); *H01L 33/62* (2013.01); *H01L 21/76804* (2013.01); *H01L 33/486* (2013.01); *H01L 2224/18* (2013.01); *H01L 2224/24226* (2013.01); *H01L 2224/24227* (2013.01); *H01L 2224/97* (2013.01); *H01L 2924/01005* (2013.01); *H01L 2924/01006* (2013.01); *H01L 2924/01023* (2013.01); *H01L 2924/01029* (2013.01); *H01L 2924/12041* (2013.01); *H01L 2933/0066* (2013.01)

(56) References Cited

U.S. PATENT DOCUMENTS

2006/0006404 A1 1/2006 Ibbetson et al.
2009/0267108 A1 10/2009 Lin et al.
2010/0117530 A1 5/2010 Lin et al.

FOREIGN PATENT DOCUMENTS

| DE | 10 2007 046 337 A1 | 4/2009 |
| DE | 10 2008 063 757 A1 | 11/2009 |
| JP | 2002-359241 | 12/2002 |
| JP | 2006-324667 | 11/2006 |
| JP | 2009-43764 | 2/2009 |
| JP | 2009-130237 | 6/2009 |
| WO | 2006/005062 A2 | 1/2006 |

OTHER PUBLICATIONS

An English translation of Japanese Examination Report dated Jan. 28, 2014 for corresponding Japanese Patent Application No. 2013-524432.

* cited by examiner

METHOD FOR PRODUCING AT LEAST ONE OPTOELECTRONIC SEMICONDUCTOR COMPONENT

RELATED APPLICATIONS

This is a §371 of International Application No. PCT/EP2011/063987, with an international filing date of Aug. 12, 2011 (WO 2012/022695 A1, published Feb. 23, 2012), which is based on German Patent Application No. 10 2010 034 565.2, filed Aug. 17, 2010, the subject matter of which is incorporated herein by reference.

TECHNICAL FIELD

This disclosure relates to a method of producing at least one optoelectronic semiconductor component and an optoelectronic semiconductor component.

BACKGROUND

There is a need to provide a method of producing an optoelectronic semiconductor component which is cost-effective.

SUMMARY

We provide a method of producing at least one optoelectronic semiconductor component including a) providing a carrier having a top side, an underside situated opposite the top side of the carrier, and a plurality of connection areas arranged at the top side alongside one another in a lateral direction, b) applying a plurality of optoelectronic components arranged at a distance from one another in a lateral direction at the top side of the carrier, the components each having at least one contact area facing away from the carrier, c) applying protective elements to the contact areas and the connection areas, d) applying at least one electrically insulating layer to exposed locations of the carrier, of the contact area and of the protective elements, e) producing openings in the electrically insulating layer by removing the protective elements, and f) arranging electrically conductive material on the electrically insulating layer and at least in places in the openings, wherein the electrically conductive material electrically conductively connects a contact area to the connection area assigned thereto.

We also provide an optoelectronic semiconductor component including a carrier having a top side, an underside situated opposite the top side of the carrier, and at least one connection area arranged at the top side, at least one optoelectronic component arranged at the top side of the carrier and having at least one contact area facing away from the carrier, at least one electrically insulating layer applied to exposed locations of the carrier and of the optoelectronic component, at least two openings in the electrically insulating layer arranged at a distance from one another in a lateral direction above the connection area and the contact area, electrically conductive material arranged on the electrically insulating layer and at least in places in the openings, wherein a lateral extent of at least one of the openings decreases, proceeding from a side of the electrically insulating layer facing away from the carrier, in a direction of the underside of the carrier, and the electrically conductive material electrically conductively connects the contact area to the connection area, and protective elements at the top side of the carrier along separating lines at the carrier are applied.

We further provide a method of producing at least one optoelectronic semiconductor component, including a) providing a carrier having a top side, an underside situated opposite the top side of the carrier, and a plurality of connection areas arranged at the top side alongside one another in a lateral direction, b) applying a plurality of optoelectronic components arranged at a distance from one another in a lateral direction at the top side of the carrier, the components each having at least one contact area facing away from the carrier, c) applying protective elements to the contact areas and the connection areas, d) applying at least one electrically insulating layer to exposed locations of the carrier, of the contact areas and of the protective elements, e) producing openings in the electrically insulating layer by removing the protective elements, and f) arranging electrically conductive material on the electrically insulating layer and at least in places in the openings, wherein the electrically conductive material electrically conductively connects a contact area to the connection area assigned thereto, and before step d) protective elements at the top side of the carrier are applied at the carrier along separating lines.

DETAILED DESCRIPTION

A first step of our method may involve providing a carrier having a top side and an underside situated opposite the top side of the carrier. The carrier can be a circuit board or a metallic leadframe. It is likewise possible for the carrier to be flexible and a film, for example. The carrier can be formed with an electrically conductive material, for example, a metal and/or an electrically insulating material, for example, a thermosetting plastic or thermoplastic material and/or else a ceramic material.

An area formed by a part of the outer area of the carrier is respectively formed at the top side and the underside. The area at the underside is the part of the outer areas of the carrier which faces a contact carrier, for example, a circuit board in the mounted state of the carrier.

By way of example, the area at the underside of the carrier is a mounting area which can mount the later semiconductor component on the contact carrier. Furthermore, the carrier has a plurality of connection areas arranged alongside one another in a lateral direction at the top side. In a "lateral direction" means a direction parallel to the main extension direction of the carrier. "Alongside one another" means that the connection locations are arranged at a distance from one another in a lateral direction.

A next step of the method may involve applying a plurality of optoelectronic components arranged at a distance from one another in a lateral direction at the top side of the carrier. The optoelectronic components each may have at least one contact area facing away from the carrier. By way of example, interspaces between the individual optoelectronic components are present in a lateral direction. In a plan view of the carrier, the interspaces may be delimited by side areas of two optoelectronic components, respectively, adjacent to one another and the mounting area of the carrier facing the components. The at least one contact area may electrically contact the optoelectronic semiconductor component and is formed with an electrically conductive material, for example, a metal.

Preferably, a connection area of the carrier is assigned uniquely or one-to-one to each contact area of an optoelectronic component. By way of example, the connection areas and the optoelectronic components are arranged alongside one another in a lateral direction. In other words, a connection area is respectively adjacent to a contact area of the optoelectronic component that is assigned to it. By way of example, the optoelectronic component is bonded, soldered or electrically conductively adhesively bonded by an outer area facing away from the contact area on a contact location of the carrier. The optoelectronic component can be a radiation-receiving or a radiation-emitting semiconductor chip. By way of example, the semiconductor chip is a luminescence diode chip. The luminescence diode chip can be a light-emitting diode chip or a laser diode chip.

A next step may involve applying protective elements to the contact and connection areas. That is to say that the protective elements at least in places are in direct contact with the connection areas and the contact areas. In a plan view of the carrier, the protective elements overlap the contact areas and the connection areas at least in places in a vertical direction. In this case, "vertical direction" denotes a direction perpendicular to the lateral direction.

A next step may involve applying at least one electrically insulating layer to exposed locations of the carrier, of the contact areas and of the protective elements. Preferably, neither a gap nor an interruption is formed between the electrically insulating layer and the exposed locations of the carrier, of the contact areas and the protective elements.

A next step may involve removing the protective elements as a result of which openings are produced in the electrically insulating layer. The openings extend in a vertical direction completely through the electrically insulating layer. By way of example, the openings have at least one side area. The at least one side area of the opening is formed at least in places by the electrically insulating layer.

A next step may involve arranging electrically conductive material on the electrically insulating layer and at least in places in the openings, wherein the electrically conductive material electrically conductively connects a contact area to the connection area assigned thereto. The electrically conductive material electrically conductively connects an optoelectronic component to a connection area of the carrier assigned to the component and, in this case, runs between the optoelectronic component and the connection area at least in places at a top side of the electrically insulating layer facing away from the carrier. In this case, the electrically conductive material can be arranged in places directly on an outer area of the electrically insulating layer. By way of example, the electrically conductive material is formed with a metal or an electrically conductive adhesive. Preferably, an electrically conductive connection between an optoelectronic component and a connection area of the carrier assigned to the optoelectronic component is formed completely by the electrically conductive material. By way of example, the openings are completely filled with the electrically conductive material.

A first step may involve providing a carrier having a top side, an underside situated opposite the top side of the carrier, and a plurality of connection areas arranged alongside one another in a lateral direction at the top side. A next step involves arranging a plurality of optoelectronic components arranged at a distance from one another in the lateral direction at the top side of the carrier, wherein the optoelectronic components each have at least one contact area facing away from the carrier. A next step may involve applying protective elements to the contact areas and the connection areas. A further step may involve applying at least one electrically insulating layer to exposed locations of the carrier, of the contact areas and of the protective elements. Furthermore, a next step may involve removing the protective elements, as a result of which openings are produced in the electrically insulating layer. A next step may involve arranging electrically conductive material on the electrically insulating layer and at least in places in the openings, wherein the electrically conductive material electrically conductively connects a contact area to the connection area assigned thereto.

In this case, the method of producing an optoelectronic semiconductor component as described is based on the insight, inter alia, that of an optoelectronic semiconductor component with which contact is made through an electrically insulating layer can be cost-intensive. To expose contacts of the optoelectronic component covered by the electrically insulating layer, for example, the electrically insulating layer can be removed at these locations by material removal, for example, by drilling. After material removal, the contact areas are exposed and electrical contact can be made with them externally. However, such subsequent exposure of the contact areas can be cost-intensive and time-consuming. Furthermore, the contact area of the optoelectronic component can be damaged by such material removal.

Then, to provide a method of producing at least one optoelectronic semiconductor component which is cost-effective and less time-consuming, the method described makes use of the concept, inter alia, of arranging protective elements on the respective contacts of the optoelectronic component before the electrically insulating layer is applied to the optoelectronic component. In other words, the contacts are covered by the protective elements at least in places. If, in a next step, the electrically insulating layer is then applied to exposed locations of the optoelectronic semiconductor component, the contact areas at least in places are not in direct contact with the electrically insulating layer. In a next step, the protective element can then be removed from the contact area. After removal of the protective element, an opening is introduced in the electrically insulating layer, as a result of which the contact areas are exposed at least in places and contact can be made with them externally via the openings. In other words, the protective element replaces material removal above the contact areas in the electrically insulating layer. Such a method is not only cost-effective and less time-consuming, but also particularly material-preserving for the contact areas since the electrically insulating layer no longer has to be removed to expose the contact areas. Likewise, the method described obviates a subsequent cleaning process involving a high outlay, for example, in the openings of the electrically insulating layer. Furthermore, the method is flexible in terms of the manufacturing sequence since, for example, the protective elements can be applied step-by-step. Advantageously, the contact areas are not damaged by, for example, high-energy laser light. By avoiding surface damage at the contact areas, the contact areas can be contact-connected more reliably as a result of which an optical output power of the later semiconductor component is increased.

The electrically insulating layer may be radiation-reflective or radiation-absorbent. "Radiation-reflective" means, in particular, that the electrically insulating layer is at least 80%, preferably more than 90%, reflective to light impinging on it. By way of example, the electrically insulating layer appears white to an external observer. By way of example, for this purpose, radiation-reflective particles formed, for example, with at least one of the materials $TiO_2$, $BaSo_4$, $ZnO$ or $Al_xO_y$, or containing one of the materials, are introduced into the electrically insulating layer. In the case of a radiation-absorbent electrically insulating layer, the electrically insulating layer can appear black or colored to an external observer. By way of example, carbon black particles are then introduced into the electrically insulating layer.

The electrically insulating layer may be a potting material applied by a potting process. By way of example, for this purpose, the electrically insulating layer is applied to exposed locations of the carrier, of the contact areas and of the protective elements by a potting process and subsequent curing.

At least one of the protective elements may be formed with at least one of the materials semiconductor material, ceramic material, plastics material, or contains at least one of the materials.

The protective elements may be applied by at least one of the processes jetting, laminating, dispensing, screen printing, injecting. By way of example, in the case of jetting, the electrically insulating layer is applied by printing. In the case of dispensing, it is possible for the electrically insulating layer to be applied in the form of drops, for example, by a pipette instrument.

A lateral extent of at least one of the protective elements may decrease, proceeding from a side of the protective elements which faces away from the carrier, in the direction of the underside of the carrier. "Lateral extent" denotes the maximum distance between two points of the respective protective element which lie in the same plane in a lateral direction. If the protective element is circular, for example, in a plan view, then the lateral extent is the diameter. By way of example, at least one of the protective elements is conical in a lateral view. At least one of the protective elements then tapers, proceeding from that side of the protective element which faces away from the carrier, in the direction of the underside of the carrier.

Before step d), protective elements at the top side of the carrier may be applied at the carrier along separating lines. In this case, too, further openings are produced after removal of the protective elements in the region of the separating lines.

After removal of the protective elements, the carrier may be singulated into individual optoelectronic semiconductor components along the separating lines. Since the electrically insulating layer has been removed in the region of the separating lines, singulation only has to be effected just through the carrier. As a result, it is possible to dispense with separating processes that involve high outlay and are not very material-preserving. In other words, it is possible to dispense with time-consuming processes involving high outlay for singulation. This leads to a saving of costs and faster manufacture of the optoelectronic semiconductor components.

The protective elements may terminate flush with the electrically insulating layer in a vertical direction. That is to say that neither a gap nor an interruption is formed between the protective elements and the electrically insulating layer in a lateral direction. By way of example, the protective elements and the electrically insulating layer together form a continuous and contiguous plane. Preferably, the protective elements are externally visible.

Before step d), at least one conversion element may be applied to a radiation passage area of an optoelectronic component. Via the radiation passage area, by way of example, electromagnetic radiation generated within an optoelectronic component is coupled out from the optoelectronic component or electromagnetic radiation entering into the optoelectronic component through the radiation passage area is detected by the optoelectronic component. The conversion element serves to at least partly convert electromagnetic radiation generated primarily within the optoelectronic component into electromagnetic radiation having a different wavelength. By way of example, the conversion element is adhesively bonded onto the radiation passage area.

Before step d), a protective layer may be applied to a radiation passage area of an optoelectronic component which covers the radiation passage area at least in places, wherein the protective layer is removed after step d), as a result of which a window is produced in the electrically insulating layer. The protective layer is applied, for example, directly to the radiation passage area of an optoelectronic component and covers the area at least in places. At places where the protective layer is applied to the radiation passage area, after step d) the electrically insulating layer may not be in direct contact with the optoelectronic component. In other words, at these places the protective layer may be arranged between the radiation passage area and the electrically insulating layer. After the electrically insulating layer has been applied, the electrically insulating layer can be removed from the protective layer, for example, by high-energy laser light. Afterward, the protective layer can also be removed from the radiation passage area of the optoelectronic component. The protective layer can be removed by etching the protective layer, for example, using potassium hydroxide (also designated KOH). By way of example, the window in the electrically insulating layer produced after removal of the protective layer is formed by at least one side area, a bottom area and a top area situated opposite the bottom area. By way of example, the side area is completely formed by the electrically insulating layer, wherein the bottom area can be formed, for example, completely by the optoelectronic component. It is possible for the protective layer to be formed with the same material as the protective elements. In this context, the "same material" means that the materials of the protective layer and the material of the protective elements are identical. Likewise, the protective layer can be applied by the same method as the protective elements.

At least one conversion element and/or a further potting material may be arranged in the window, wherein the further potting material contains at least one luminescence conversion material. The luminescence conversion material serves for at least partly converting electromagnetic radiation generated primarily within the optoelectronic component into electromagnetic radiation having a different wavelength.

Furthermore, an optoelectronic semiconductor component is also provided.

By way of example, the optoelectronic semiconductor component can be produced by the method described, as described in conjunction with one or more of the examples mentioned above. That is to say that the features of the method described are also disclosed for the optoelectronic semiconductor component described, and vice versa.

The optoelectronic semiconductor component may comprise a carrier having a top side, an underside situated opposite the top side of the carrier, and at least one connection area arranged at the top side.

The optoelectronic semiconductor component may comprise at least one optoelectronic component arranged at the top side of the carrier and which has at least one contact area facing away from the carrier.

The optoelectronic semiconductor component may comprise at least one electrically insulating layer applied to exposed locations of the carrier and of the optoelectronic component. By way of example, the electrically insulating layer covers all exposed locations of the optoelectronic component in a positively locking manner.

The optoelectronic semiconductor component may comprise at least two openings in the electrically insulating layer arranged at a distance from one another in a lateral direction above the connection area and the contact area. That is to say that in a vertical direction the connection area and the contact area overlap the openings at least in places and are freed of the electrically insulating layer at these places.

The optoelectronic semiconductor component may comprise electrically conductive material arranged on the electrically insulating layer and at least in places in the openings.

A lateral extent of at least one of the openings may decrease, proceeding from a side of the electrically insulating layer facing away from the carrier, in the direction of the underside of the carrier. In a lateral view, the openings can be conical. In particular, the openings are not produced by material removal in the electrically insulating layer. By way of example, the openings, the contact area and the connection area have no mechanical surface damage. In particular, the side areas of the openings, for example, additionally also outer areas of the contact area and of the connection area, have no traces of material removal, for example, in the form of thermal surface damage. That is to say that the side areas and the outer areas are then not processed and/or damaged by high-energy laser light. In other words, the openings can be produced by the protective elements described which are removed from the electrically insulating layer.

The electrically conductive material may electrically conductively connect the contact area to the connection area.

The method described and an optoelectronic semiconductor component described are explained in greater detail below on the basis of examples and the associated figures.

In the examples and the figures, identical or identically acting constituent parts are provided with the same reference signs. The elements illustrated should not be regarded as true to scale; rather, individual elements may be illustrated with an exaggerated size to afford a better understanding.

Figure 1:
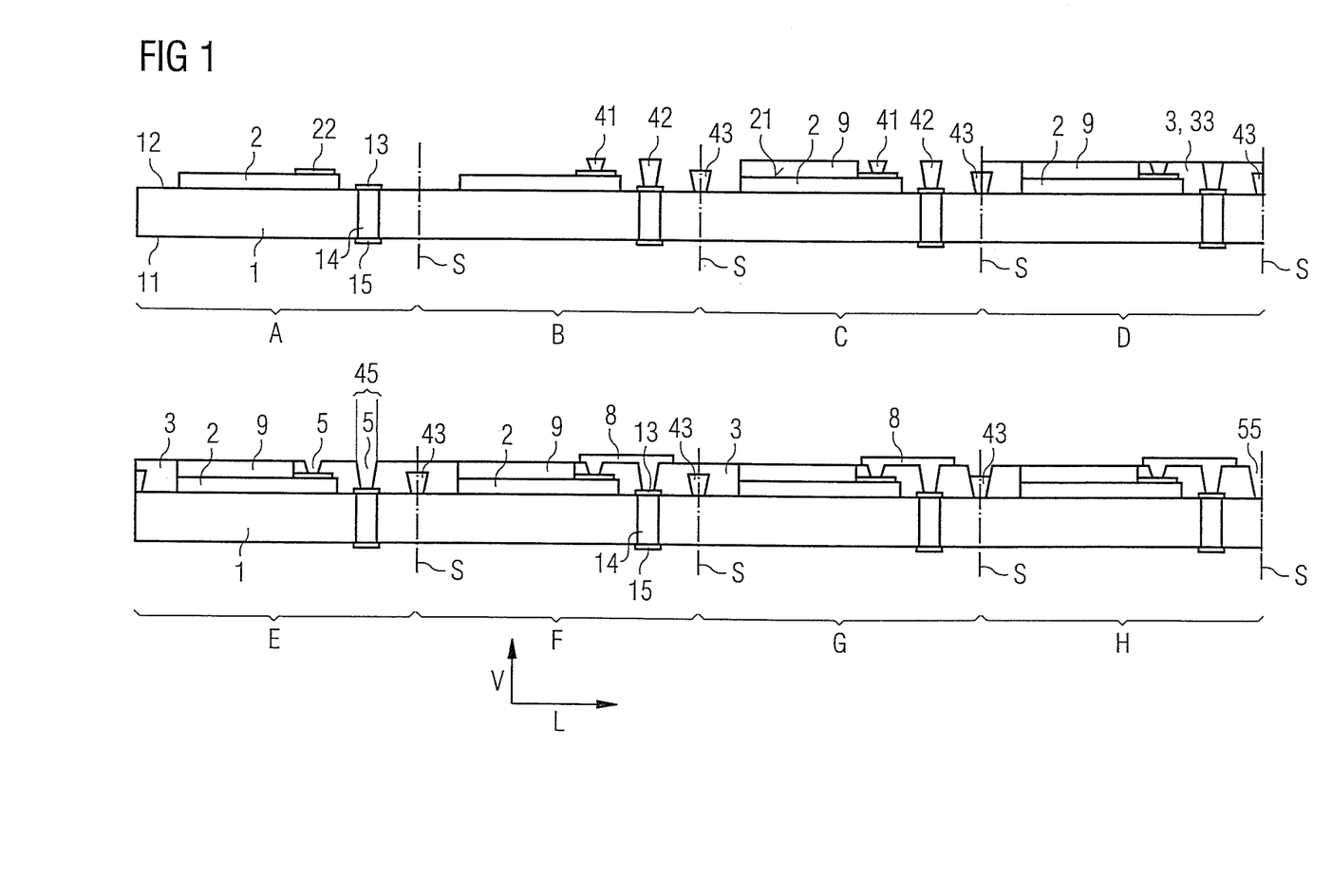
FIGS. 1 and 2 show individual manufacturing steps of producing two examples by a method described.

FIG. 1 shows in section A steps a) and b), wherein provision is first made of a carrier 1 having a top side 12 and an underside 11 situated opposite the top side 12 of the carrier 1. Furthermore, the carrier 1 has a plurality of connection areas 13 arranged alongside one another in a lateral direction L at the top side 12. The optoelectronic components 2 are arranged on the carrier 1. Each of the optoelectronic components 2 has a contact area 22 facing away from the carrier 1. The optoelectronic components 2 can be radiation-emitting semiconductor chips that emit ultraviolet radiation or visible light.

Sections A to H of FIG. 1 illustrate that the connection areas 13 are each formed by a plated-through hole 14. The plated-through hole 14, proceeding from the top side 12 of the carrier 1, extends in the direction of the underside 11 of the carrier 1 completely through the carrier 1. At the underside 11, the plated-through hole 14 forms a further connection area 15. By way of example, with a further connection area 15 of this type, a later optoelectronic semiconductor component 100 is surface-mountable.

Section B of FIG. 1 shows, in a step c), how protective elements 41 and 42 are respectively applied to the contact areas 22 of the optoelectronic components 2 and the connection areas 13. In this case, the protective elements 41 and 42 are applied by jetting. Furthermore, it can be discerned from section B of FIG. 1 that protective elements 43 are additionally applied along separating lines S. In this case, the protective elements 41, 42 and/or 43 can be formed with a photoresist and/or a hot melt adhesive.

Section C of FIG. 1 illustrates how a conversion element 9 is applied to a radiation passage area 21 of the optoelectronic components 2. In this case, the conversion element 9 is a layer and covers the radiation passage area 21 of the optoelectronic component 2 at least in places. By way of example, the conversion element 9 partly converts blue light emitted by the optoelectronic component 2 into yellow light which can then mix together with the blue light to form white light.

As illustrated in section D of FIG. 1, in a next step d), an electrically insulating layer 3 is applied to exposed locations of the protective elements 41, 42 and 43, of the optoelectronic components 2, of the conversion elements 9 and exposed locations of the carrier 1 by a potting process. In other words, the electrically insulating layer 3 is a potting material 33 applied by a potting process. In this case, in a vertical direction V, the protective elements 41 and 42 and the conversion elements 9 terminate flush with the electrically insulating layer 3. In contrast, the protective element 43 is covered by the electrically insulating layer 3 completely and in a positively locking manner at exposed locations. In a plan view of the carrier 1, the protective elements 41 and 42 are externally visible and, for example, freely accessible.

Section E of FIG. 1 illustrates a step e), wherein the protective elements 41 and 42 are removed again. In this case, a lateral extent 45 of the protective elements 41 decreases, proceeding from a side of the protective elements 41 and 42 facing away from the carrier 1, in the direction of the underside 11 of the carrier 1. In other words, the protective elements 41 and 42 are conical. By virtue of such a conical shape of the protective elements 41 and 42, the protective elements 41 and 42 can be removed again particularly simply and cost-effectively. By way of example, removal of the protective elements 41 and 42 can take place by aqueous stripping, that is to say by wet-chemical etching of the protective elements 41 and 42.

Section F of FIG. 1 illustrates how, in a next step f), electrically conductive material 8 is arranged on the electrically insulating layer 3 and in openings 5 produced by removal of the protective elements 41, 42 in the electrically insulating layer 3. On account of the conical form of the protective elements 41 and 42, the openings 5 are likewise conical. The openings 5 are therefore not produced by material removal in the electrically insulating layer such as drilling, for example.

The electrically conductive material 8 is arranged completely in the openings 5 and in a lateral direction L between the two openings 5 on an outer area of the electrically insulating layer 3 facing away from the carrier 1. By virtue of the conical configuration of the openings 5, the latter can be filled with the electrically conductive material 8 in a particularly simple manner. By way of example, application of the electrically conductive material 8 takes place by sputtering and/or jetting. By way of example, the electrically conductive material 8 is formed with Ti and/or Cu. The electrically conductive material 8 is in direct contact with the respective contact areas 22 of the optoelectronic components 2 and with the connection areas 13. In other words, in this case, each of the optoelectronic components 2 electrically conductively contact-connects the electrically conductive material 8 via the connection location 13 and via the plated-through hole 14 to the further connection location 15.

Section G of FIG. 1 further illustrates how the electrically insulating layer 3 is removed in the region of the protective element 43 above the protective element 43. By way of example, the removal takes place by high-energy laser light.

Furthermore, section H of FIG. 1 illustrates, in a next step, how the protective element 43 is removed, as a result of which a further opening 55 is produced in the electrically insulating layer 3. Advantageously, during singulation into individual optoelectronic semiconductor components 100, it is not necessary to effect singulation through the electrically insulating layer 3, but rather only through the carrier 1 along the separating line S.

Figure 2:
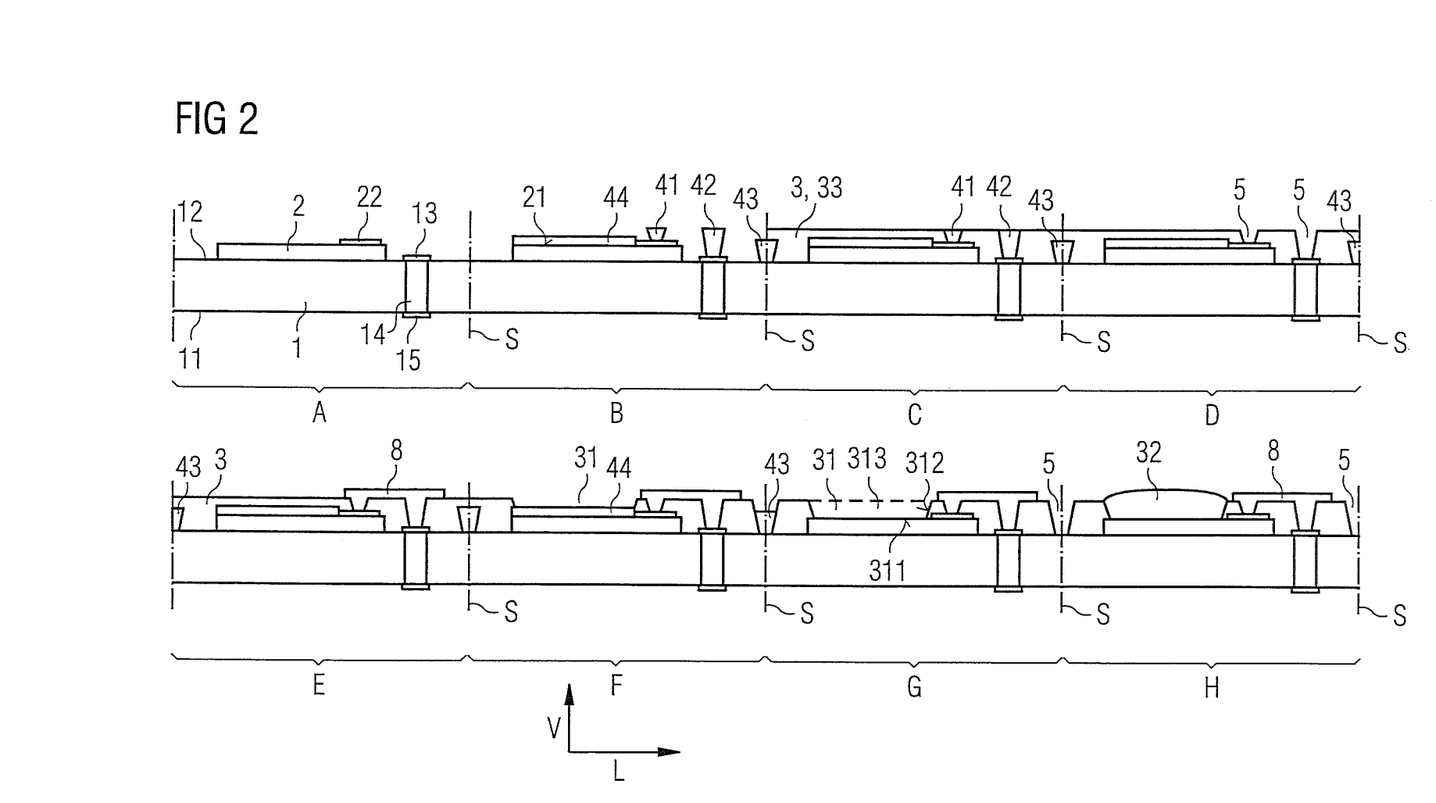

Individual manufacturing steps of producing a further example by a method described here are described in FIG. 2.

In contrast to the method illustrated in FIG. 1, application of a conversion element 9 is dispensed with in the method illustrated in FIG. 2. Instead, in section B of FIG. 2, a protective layer 44 is applied to a radiation passage area 21 of each of the optoelectronic components 2. In other words, the protective layer 44 covers the radiation passage area 21 of the optoelectronic components 2 at least in places.

It can be discerned in section C of FIG. 2 that the protective layer 44 is covered by the electrically insulating layer 3 completely and in a positively locking manner at all exposed locations.

Sections D and E of FIG. 2 once again illustrate step e), how openings 5 are produced by removal of the protective elements 41 and 42 and electrically conductive material 8 is subsequently arranged in the openings 5, as described in the explanations concerning FIG. 1.

Section F of FIG. 2 illustrates how the electrically insulating layer 3 is removed from the protective layer 44. In other words, the protective layer 44 is then free of the electrically insulating layer 3 at least in places. In this context, "free" means that the protective layer 44 is no longer covered by the electrically insulating layer 3. It is possible at most that, in a manner governed by production, material residues of the electrically insulating layer 3 are still situated on the protective layer 44 at the exposed locations.

In a next step illustrated in section G of FIG. 2, the protective layer 44 is removed from the radiation passage area 21. As a result of the removal, a window 31 is produced in the electrically insulating layer 3, the window having in this case a bottom area 311, an opening 313 situated opposite the bottom area 311, and side areas 312. The side areas 312 are completely formed by the electrically insulating layer 3, wherein the bottom area 311 of the window 31 is completely formed by the radiation passage area 21.

Section H of FIG. 2 furthermore illustrates that a further potting material 32 containing a luminescence conversion material is arranged into the window 31. In this case, the luminescence conversion material is phosphorus which is introduced into the material of the further potting material 32. By way of example, the optoelectronic components 2 are RGB light-emitting diode chips whose emitted white light is partly converted into light having a different wavelength.

Figure 3:
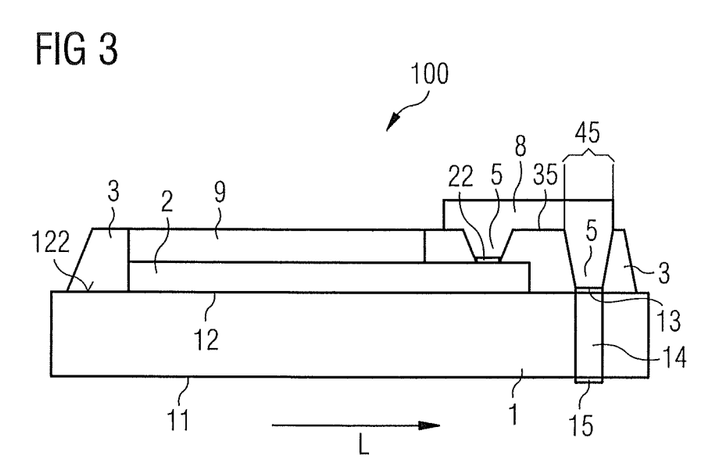
FIG. 3 shows, in a schematic side view, an example of an optoelectronic semiconductor component described.

An optoelectronic component 100 described here is illustrated in a lateral view in FIG. 3. The optoelectronic component 100 comprises the carrier 1 having the top side 12 and an underside 11 situated opposite the top side 12. On a mounting area 122 formed at the top side 12, an optoelectronic component 2 is fitted and electrically conductively contact-connected to the carrier 1. The electrically conductive material 8 is arranged in openings 5 in the electrically insulating layer 3 and completely fills the openings 5. Furthermore, the electrically conductive material 8 extends along a top side 35 of the electrically insulating layer 3 in a lateral direction L between the two openings 5. The electrically conductive material 8 forms a continuous electrically conductive connection between the connection area 13 and the contact area 22. In particular, the openings are not produced by material removal in the electrically insulating layer 3. That is to say that the openings 5, the contact area 22 and the connection area 13 have no surface damage caused by drilling.

Our methods and components are not restricted by the description on the basis of the examples. Rather, this disclosure encompasses any novel feature and also any combination of features, which in particular includes any combination of features in the appended claims, even if the feature or combination itself is not explicitly specified in the claims or the examples.

The invention claimed is:

1. A method of producing at least one optoelectronic semiconductor component comprising:
   a) providing a carrier having a top side, an underside situated opposite the top side of the carrier, and a plurality of connection areas arranged at the top side alongside one another in a lateral direction;
   b) applying a plurality of optoelectronic components arranged at a distance from one another in a lateral direction at the top side of the carrier, said components each having at least one contact area facing away from the carrier;
   c) applying protective elements to the contact areas and the connection areas;
   d) applying at least one electrically insulating layer to exposed locations of the carrier, of the contact areas and of the protective elements;
   e) producing openings in the electrically insulating layer by removing the protective elements; and
   f) arranging electrically conductive material on the electrically insulating layer and at least in places in the openings, wherein the electrically conductive material electrically conductively connects a contact area to the connection area assigned thereto,
   wherein, before step d), a protective layer is applied to a radiation passage area of an optoelectronic component which covers the radiation passage area at least in places, and the protective layer is removed after step d) as a result of which a window is produced in the electrically insulating layer.

2. The method according to claim 1, wherein the electrically insulating layer is radiation-reflective or radiation-absorbent.

3. The method according to claim 1, wherein the electrically insulating layer is a potting material applied by a potting process.

4. The method according to claim 1, wherein at least one of the protective elements is formed with or contains at least one material selected from the group consisting of semiconductor material, ceramic material and plastics material.

5. The method according to claim 1, wherein at least one of the protective elements is applied by at least one process selected from the group consisting of jetting, laminating, dispensing, screen printing and injecting.

6. The method according to claim 1, wherein a lateral extent of at least one of the protective elements decreases, proceeding from a side of the protective elements facing away from the carrier, in a direction of the underside of the carrier.

7. The method according to claim 1, wherein, before step d), protective elements at the top side of the carrier are applied at the carrier along separating lines.

8. The method according to claim 7, wherein, after removal of the protective elements, the carrier is singulated into individual optoelectronic semiconductor components along the separating lines.

9. The method according to claim 1, wherein, in a vertical direction, the protective elements terminate flush with the electrically insulating layer.

10. The method according to claim 1, wherein, before step d), at least one conversion element is applied to a radiation passage area of an optoelectronic component.

11. The method according to claim 1, wherein at least one conversion element and/or a further potting material are/is arranged in the window, and the further potting material contains at least one luminescence conversion material.

12. A method of producing at least one optoelectronic semiconductor component, comprising:

a) providing a carrier having a top side, an underside situated opposite the top side of the carrier, and a plurality of connection areas arranged at the top side alongside one another in a lateral direction;
b) applying a plurality of optoelectronic components arranged at a distance from one another in a lateral direction at the top side of the carrier, said components each having at least one contact area facing away from the carrier;
c) applying protective elements to the contact areas and the connection areas;
d) applying at least one electrically insulating layer to exposed locations of the carrier, of the contact areas and of the protective elements;
e) producing openings in the electrically insulating layer by removing the protective elements; and
f) arranging electrically conductive material on the electrically insulating layer and at least in places in the openings,
wherein the electrically conductive material electrically conductively connects a contact area to the connection area assigned thereto, and
before step d), protective elements at the top side of the carrier are applied at the carrier along separating lines, and a protective layer is applied to a radiation passage area of an optoelectronic component which covers the radiation passage area at least in places, and the protective layer is removed after step d) as a result of which a window is produced in the electrically insulating layer.

* * * * *